United States Patent
Chen et al.

(10) Patent No.: US 12,055,865 B2
(45) Date of Patent: *Aug. 6, 2024

(54) EXTREME ULTRAVIOLET LITHOGRAPHY SYSTEM

(71) Applicant: Taiwan Semiconductor Manufacturing Company, Ltd., Hsinchu (TW)

(72) Inventors: Ssu-Yu Chen, New Taipei (TW); Po-Chung Cheng, Chiayi County (TW); Li-Jui Chen, Hsinchu (TW); Che-Chang Hsu, Taichung (TW); Chi Yang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 434 days.

This patent is subject to a terminal disclaimer.

(21) Appl. No.: 17/395,465

(22) Filed: Aug. 6, 2021

(65) Prior Publication Data

US 2021/0364934 A1 Nov. 25, 2021

Related U.S. Application Data

(63) Continuation of application No. 16/805,861, filed on Mar. 2, 2020, now Pat. No. 11,086,237.

(60) Provisional application No. 62/880,649, filed on Jul. 30, 2019.

(51) Int. Cl.
 G03F 7/00 (2006.01)
 H05G 2/00 (2006.01)

(52) U.S. Cl.
 CPC ...... *G03F 7/70916* (2013.01); *G03F 7/70033* (2013.01); *G03F 7/70166* (2013.01); *G03F 7/70175* (2013.01); *G03F 7/70883* (2013.01); *G03F 7/70891* (2013.01); *G03F 7/70908* (2013.01)

(58) Field of Classification Search
 CPC ........... H05G 2/00; H05G 2/005; H05G 2/006
 See application file for complete search history.

(56) References Cited

U.S. PATENT DOCUMENTS

| | | | |
|---|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 7/2015 | Huang et al. |
| 9,184,054 B1 | 11/2015 | Huang et al. |
| 9,256,123 B2 | 2/2016 | Shih et al. |

(Continued)

FOREIGN PATENT DOCUMENTS

WO WO-2016006162 A1 * 1/2016 ............ G03F 7/20

*Primary Examiner* — David E Smith
(74) *Attorney, Agent, or Firm* — JCIPRNET

(57) ABSTRACT

An extreme ultraviolet (EUV) lithography system includes a vane bucket module. The vane bucket module includes a temperature adjusting pack and a collecting tank inserted into the temperature adjusting pack. The temperature adjusting pack has a plurality of inlets. The collecting tank has a cover and the cover includes a plurality of through holes. The inlets of the temperature adjusting pack are aligned with the through holes of the cover. Thicknesses of edges of the cover is different from a thickness of a center of the cover.

20 Claims, 7 Drawing Sheets

(56) References Cited

U.S. PATENT DOCUMENTS

| | | |
|---|---|---|
| 9,529,268 B2 | 12/2016 | Chang et al. |
| 9,548,303 B2 | 1/2017 | Lee et al. |
| 11,086,237 B2* | 8/2021 | Chen .................. G03F 7/70908 |
| 2015/0338753 A1* | 11/2015 | Riepen .................. H05G 2/005 |
| | | 250/504 R |

* cited by examiner

EXTREME ULTRAVIOLET LITHOGRAPHY SYSTEM

CROSS-REFERENCE TO RELATED APPLICATION

This application is a continuation application of and claims the priority benefit of a prior application Ser. No. 16/805,861, filed on Mar. 2, 2020. The prior application Ser. No. 16/805,861 claims the priority benefit of U.S. provisional application Ser. No. 62/880,649, filed on Jul. 30, 2019. The entirety of the above-mentioned patent application is hereby incorporated by reference herein and made a part of this specification.

BACKGROUND

The semiconductor industry has experienced rapid growth due to continuous improvements in the integration density of various electronic components. For the most part, this improvement in integration density has come from repeated reductions in feature size, which allows more of the smaller components to be integrated into a given area. In order to achieve miniaturization in the components, the need to perform higher resolution lithography processes grows. For example, the decrease in size of devices may be satisfied with the adoption of extreme ultraviolet lithography.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
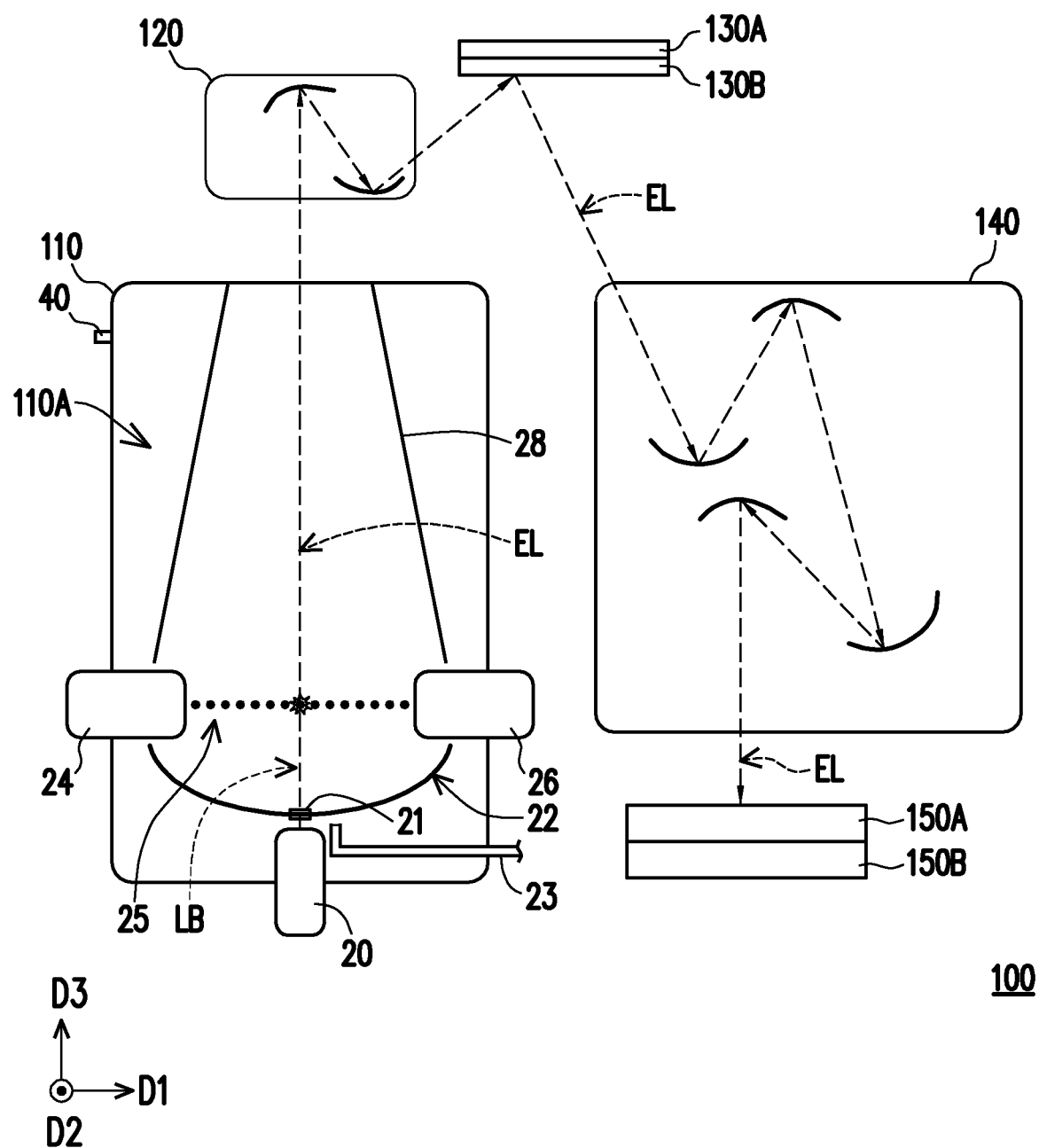
FIG. 1 is a schematic view illustrating an extreme ultraviolet (EUV) lithography system in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic view illustrating an extreme ultraviolet (EUV) lithography system 100 in accordance with some embodiments of the disclosure. In some embodiments, the EUV lithography system 100 may be referred to as a scanner that is operable to perform lithography exposing processes with respective radiation source and/or exposure mode. In some embodiments, the EUV lithography system 100 is a system or a device designated to expose a resist layer by EUV light. For example, when the resist layer is made of a material sensitive to the EUV light, the EUV lithography system 100 may be utilized to process the resist layer.

Referring to FIG. 1, the EUV lithography system 100 includes a radiation source 110 that is used to generate radiation light. In some embodiments, the radiation source 110 is a light source capable of generating EUV light. For example, the radiation source 110 is able to generate EUV light having a wavelength ranging from about 1 nm to about 100 nm, such as 13.5 nm. In some embodiments, the radiation source 110 employs a laser produced plasma (LPP) mechanism to generate plasma and further generate EUV light from the plasma. As illustrated in FIG. 1, the radiation source 110 includes a vessel chamber 110A. In some embodiments, the vessel chamber 110A is an enclosed space. In some embodiments the vessel chamber 110A is maintained in a vacuum environment to avoid absorption of the EUV radiation by air.

In some embodiments, the radiation source 110 further includes a laser generator 20 disposed at the bottom of the vessel chamber 110A. The laser generator 20 is capable of generating a laser beam LB. For example, the laser generator 20 may be a pulse carbon dioxide ($CO_2$) laser generator or a gas discharge $CO_2$ laser generator (e.g., producing radiation at about 10.6 μm) that generates the laser beam LB.

However, the disclosure is not limited thereto. In some alternative embodiments, other suitable types of lasers may be used. For example, in some alternative embodiments, a neodymium-doped yttrium aluminum garnet (Nd:YAG) laser may be used.

As illustrated in FIG. 1, the laser beam LB is directed through an output window 21 integrated with a collector 22. In some embodiments, the output window 21 is made of a suitable material substantially transparent to the laser beam LB. In some embodiments, the collector 22 is designed with proper shape to function as a mirror for EUV light collection, reflection, and/or focus. For example, the collector 22 may be designed to have a semi-ellipsoidal geometry or a hemispherical geometry. In some embodiments, the collector 22 may include a silicon carbide (SiC) substrate and a coating layer on the SiC substrate. The coating layer includes a reflective multilayer formed by a plurality of Mo/Si film pairs. In some embodiments, the collector 22 may further include a capping layer (such as Ru) over the coating layer to reflect the EUV light. In some alternative embodiments, the collector 22 may further include a grating structure designed to effectively scatter the laser beam LB directed onto the collector 22. For example, a silicon nitride layer having grating pattern may be coated on the SiC substrate to scatter the laser beam LB. In some embodiments, the collector 22 may be referred to as "LPP collector" or "EUV collector."

In some embodiments, a buffer gas may be supplied from a gas supply 23 to the vessel chamber 110A. For example, the buffer gas may be $H_2$, He, Ar, N, or another inert gas. In some embodiments, $H_2$ may be a source for H radicals generated by ionization of the buffer gas, and the H radicals may serve cleaning purposes. In some embodiments, one or more gas outlet(s) 40 may be provided in the radiation source 110 so that the buffer gas may leave the radiation source 110 from the gas outlets 40.

As illustrated in FIG. 1, the radiation source 110 further includes a droplet generator 24 and a droplet catcher 26 disposed on two opposite sides of the collector 22 along a direction D1. In some embodiments, the droplet generator 24 is positioned to be aligned with the droplet catcher 26. The droplet generator 24 is capable of generating a target material 25 and the droplet catcher 26 is configured to collect or catch excessive target material 25. In some embodiments, the target material 25 includes tin, a tin-containing liquid material such as eutectic alloy containing tin, lithium (Li), xenon (Xe), or a combination thereof. However, the disclosure is not limited thereto. In some alternative embodiments, other suitable materials may be utilized as the target material 25 as long as the material is able to generate plasma and EUV light. In some embodiments, the target material 25 is delivered in form of liquid droplets. For examples, the target material 25 may have a diameter in a range from about 10 μm to about 100 μm.

While the target material 25 travels through the vessel chamber 110A, the laser beam LB generated from the laser generator 20 is directed along a direction D3 perpendicular to direction D1. For example, the laser beam LB travels along the direction D3 to irradiate the target material 25 passing through the vessel chamber 110A. In some embodiments, the laser beam LB is able to heat the target material 25, thereby generating high-temperature plasma, which further produces EUV radiation or EUV light EL. In some embodiments, pulses of the laser generator 20 and the droplet generating rate of the droplet generator 24 are controlled to be synchronized such that the target material 25 receives peak powers consistently from the laser pulses of the laser generator 20. In some embodiments, the laser generator 20 may include a laser circuit designed to control the generation of the laser pulses. The laser circuit and the droplet generator 24 are coupled to synchronize the generation of the laser pulses (the laser beam LB) and the generations of the target material 25. In some embodiments, the target material 25 may be generated at a frequency ranging from 20 kHz to 100 kHz. In some embodiments, the target material 25 is generated at a rate of about 50 droplets per second and is introduced into a zone of excitation at a speed of about 10 m/s to about 100 m/s. In some embodiments, the excessive target material 25 (for example, the target material 25 missed by the laser beam LB) reaches the droplet catcher 26 and is collected by the droplet catcher 26. In some embodiments, the EUV light EL is collected, reflected, and/or focused by the collector 22 to serve as a radiation for lithography exposing processes.

Figure 2:
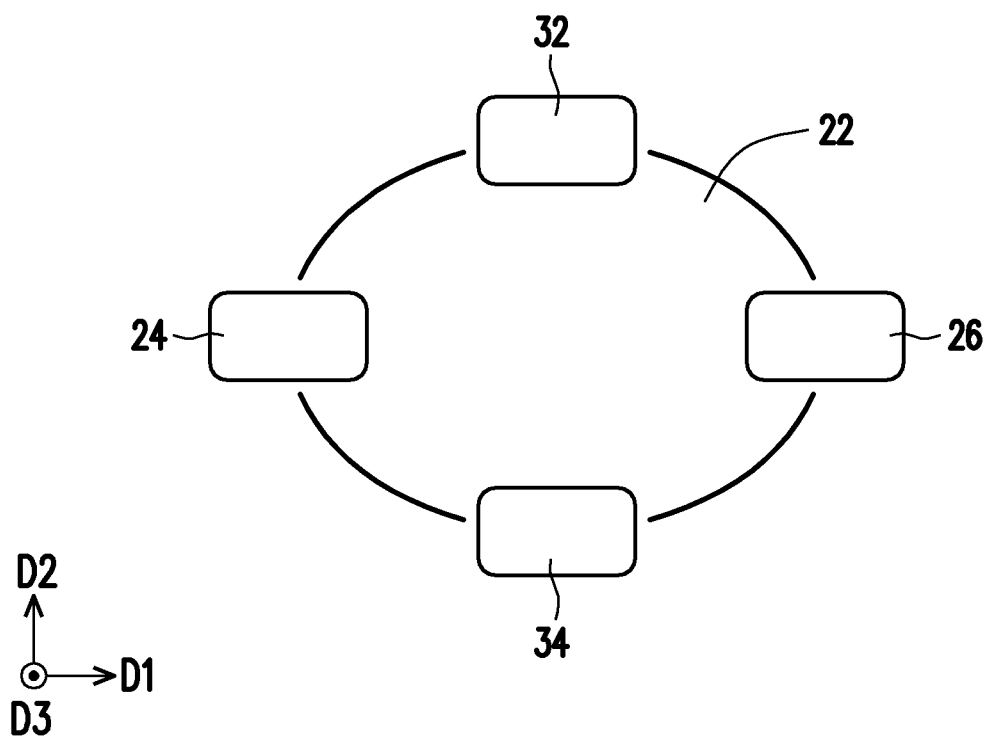
FIG. 2 is a simplified top view of the radiation source of the EUV lithography system in FIG. 1.

In some embodiments, the radiation source 110 may further include a vane structure 28 for collecting debris. In some embodiments, the vane structure 28 is disposed over the collector 22. The debris includes, the target material 25 missed by the laser beam LB and the droplet catcher 26, the byproducts produced during the EUV light EL generation process, or the target material 25 being bombarded by atomic $H_2$ or H radicals (buffer gas). For example, the debris includes stannane ($S_nH_4$) or tin droplets. In some embodiments, the vane structure 28 collects the debris and guides the debris to a vane bucket module 32 (shown in FIG. 2) to prevent the surface of the collector 22 and/or other elements/components inside the vessel chamber 110A from being coated with the debris. FIG. 2 is a simplified top view of the radiation source 110 of the EUV lithography system 100 in FIG. 1. For simplicity, some elements of the radiation source 110 are omitted in FIG. 2 and the elements shown in FIG. 2 are represented by boxes. Referring to FIG. 2, the radiation source 110 further includes the vane bucket modules 32 and a monitoring module 34 on two opposite sides of the collector 22 along a direction D2 perpendicular to both of the direction D1 and the direction D3. In other words, the droplet generator 24, the droplet catcher 26, the vane bucket module 32, and the monitoring module 34 are disposed to surround a center of the collector 22 and are spaced apart from one another. In some embodiments, the monitoring module 34 may include, for example, a camera or the like. In some embodiments, the monitoring module 34 may be utilized to monitor the plasma condition of the radiation source 110. That is, in some embodiments, the monitoring module 34 may be referred to as a "plasma monitoring module." The mechanism for collecting the debris and the detailed configurations of the vane bucket module 32 and the vane structure 28 will be described later.

As illustrated in FIG. 1, the EUV lithography system 100 further includes an illuminator 120. In some embodiments, the illuminator 120 includes various refractive optic components. In some embodiments, the optic components may include a single lens or a lens system having multiple lenses (zone plates). Alternatively, the optic components may include a single mirror or a mirror system having multiple mirrors. In some embodiments, the mirror or the lens of the illuminator 120 may include a multilayer thin-film coating known as Bragg reflectors. For example, the multilayer thin-film coating may include alternating layers of Mo and Si, which provides high reflectivity for radiation having wavelengths fall within the EUV range. In some embodiments, the illuminator 120 is capable of directing the light to a desired illumination position. For example, as illustrated in FIG. 1, the illuminator 120 directs the EUV light EL from the radiation source 110 onto a mask 130B. In some embodiments, the mask 130B is securely fixed on a reticle stage 130A. For example, the reticle stage 130A may include an electrostatic chuck (e-chuck) to secure the mask 130B.

In some embodiments, the mask 130B is, for example, a reflective mask. In some embodiments, the mask 130B may include a substrate with a low thermal expansion material (LTEM). The low thermal expansion material may include $TiO_2$ doped $SiO_2$ or other suitable materials with low thermal expansion. In some embodiments, the mask 130B may further include a reflective multilayer film deposited on the substrate. The reflective multilayer film includes a plurality of film pairs, such as molybdenum-silicon (Mo/Si) film pairs. Alternatively, the reflective multilayer film may include molybdenum-beryllium (Mo/Be) film pairs or other suitable materials that are configurable to highly reflect the EUV light EL. In some embodiments, the mask 130B may further include a capping layer, such as ruthenium (Ru), disposed on the reflective multilayer film for protection. In some embodiments, the mask 130B further includes an absorption layer, such as a tantalum boron nitride (TaBN) layer, deposited over the reflective multilayer film. The absorption layer is patterned to define a layer of an integrated circuit. Alternatively, another reflective layer may be deposited over the reflective multilayer film and is patterned to define a layer of an integrated circuit, thereby forming a EUV phase shift mask. However, the disclosure is not limited thereto. The configuration of the mask 130B may be varied depending on the design requirements.

As illustrated in FIG. 1, the EUV lithography system 100 further includes a projection module 140 for transferring the pattern of the mask 130B onto a semiconductor substrate 150A secured on a substrate stage 150B. In some embodiments, the projection module 140 includes reflective optics for projecting the EUV light EL. In some embodiments, the EUV light EL carrying the image information of the mask 130B is collected by the projection module 140. In some embodiments, the projection module 140 may be a projection optics box (POB). In some embodiments, the illuminator 120 and the projection module 140 may be collectively referred to as an "optical module" of the EUV lithography system 100. In some embodiments, the semiconductor substrate 150A includes a semiconductor wafer, such as silicon wafer, germanium wafer, silicon-germanium wafer, III-V group wafer, or the like. In some embodiments, the semiconductor substrate 150A may be coated with a resist layer (not shown) sensitive to the EUV light EL, so the image information of the mask 130B carried by the EUV light EL is transferred onto the resist layer and the semiconductor substrate 150A. It should be noted that the EUV lithography system 100 shown in FIG. 1 may further include other modules or be integrated with (or be coupled with) other modules.

As mentioned above, during the EUV light EL generating process, the vane structure 28 collects the debris produced and guides the debris to the vane bucket module 32 to prevent the debris from accumulating at the surface of the collector 22 and/or other elements/components inside the vessel chamber 110A, thereby ensuring that the reflectivity of the collector 22 is not compromised. The mechanism for collecting the debris will be described below in conjunction with FIG. 3.

Figure 3:
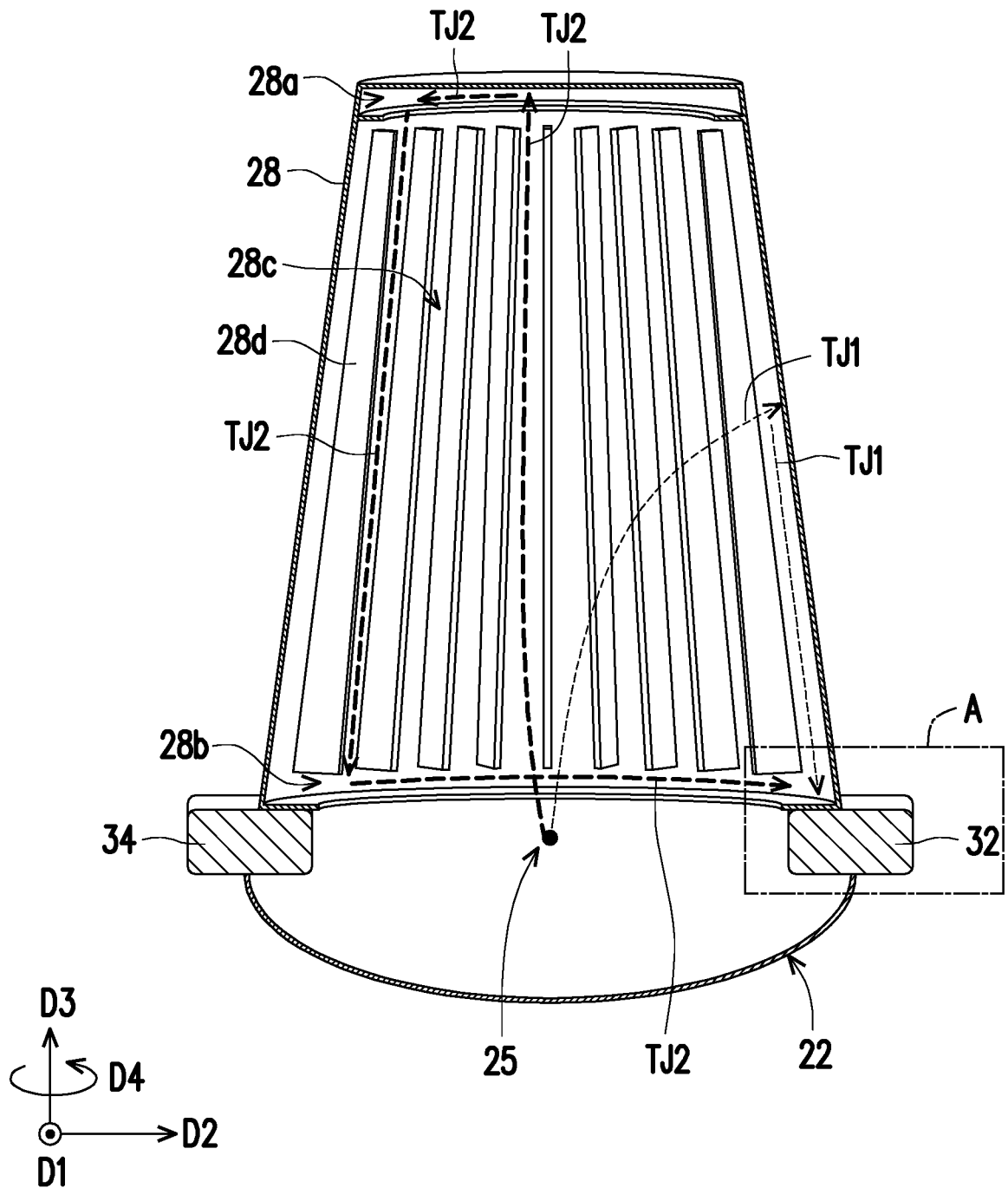
FIG. 3 is a schematic view of the radiation source of the EUV lithography system in FIG. 1 from another direction.

FIG. 3 is a schematic view of the radiation source 110 of the EUV lithography system 100 in FIG. 1 from another direction. It should be noted that some elements of the radiation source 110 are omitted in FIG. 3 for simplicity. Referring to FIG. 3, during the EUV light EL generating process, the target material 25 missed by the laser beam LB and the droplet catcher 26, the byproducts produced, or the target material 25 being bombarded by atomic $H_2$ or H radicals are splashed in the form of debris within the vessel chamber 110A. For example, the debris may splash on the vane structure 28. In some embodiments, the vane structure 28 takes the form of an elliptical conical frustum or a conical frustum. In some embodiments, the vane structure 28 includes a top circumferential gutter 28a, a bottom circumferential gutter 28b, and a plurality of vertical gutters 28c to guide the debris landed on the vane structure 28. In some embodiments, the vane structure 28 includes a plurality of vanes 28d protruding from inner walls of the vane structure 28 to form the vertical gutters 28c between two adjacent vanes 28d. In some embodiments, the vanes 28d extend along the direction D3. As such, the vertical gutters 28c also extend along the direction D3. In some embodiments, the top circumferential gutter 28a and the bottom circumferential gutter 28b are respectively located at two ends of each vane 28d. In other words, the top circumferential gutter 28a and the bottom circumferential gutter 28b are respectively located at two ends of each vertical gutter 28c. In some embodiments, the top circumferential gutter 28a is connected to the vertical gutters 28c. Meanwhile, the bottom circumferential gutter 28b is also connected to the vertical gutters 28c. In other words, the top circumferential gutter 28a is communicated with the bottom circumferential gutter 28b through the vertical gutters 28c. In some embodiments, the bottom circumferential gutter 28b is larger than the top circumferential gutter 28a. In some embodiments, the top circumferential gutter 28a and the bottom circumferential gutter 28b extend along a circumferential direction D4 with respect to an axis extending along the direction D3. For example, the top circumferential gutter 28a and the bottom circumferential gutter 28b may be circular gutters or elliptical gutters respectively enclosing the top and bottom surfaces of the elliptical conical frustum or conical frustum. The trajectories of the debris will be described below.

Referring to a first trajectory TJ1 illustrated in FIG. 3, the debris is splashed onto the vertical gutter 28c of the vane structure 28. Thereafter, due to the gravitational force, the debris travels down through the vertical gutter 28c to arrive at the bottom circumferential gutter 28b. That is, the vertical gutter 28c guides the debris to the bottom circumferential gutter 28b. In some embodiments, the debris may also have other trajectories. For example, as shown in a second trajectory TJ2, the debris is landed on the top circumferential gutter 28a. Thereafter, the debris travels along the top circumferential gutter 28a for a short distance before being pull down by the gravity to fall into the vertical gutter 28c communicating with the top circumferential gutter 28a. The debris then travels down the vertical gutter 28c to arrive at the bottom circumferential gutter 28b. Subsequently, the debris is guided by the bottom circumferential gutter 28b to arrive at a position above the vane bucket module 32. In some embodiments, the vanes 28d are rotating along the circumferential direction D4 to provide driving force for the debris in the top circumferential gutter 28a, the bottom circumferential gutter 28b, and the vertical gutters 28c. In some embodiments, the debris are collected by the vane bucket module 32. The collecting mechanism of the vane bucket module 32 will be described below in conjunction with FIG. 4.

Figure 4:
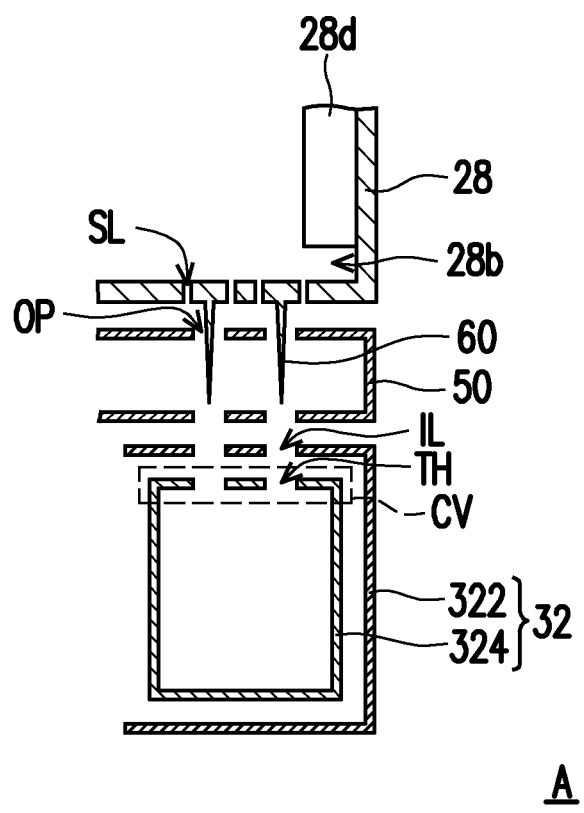
FIG. 4 is a schematic enlarged view of a region of the radiation source of the EUV lithography system in FIG. 3.

FIG. 4 is a schematic enlarged view of a region A of the radiation source 110 of the EUV lithography system 100 in FIG. 3. Referring to FIG. 4, the EUV radiation source 110 may further include a plurality of drip pins 60 protruding from the vane structure 28. For example, the drip pins 60 may protrude from a bottom wall of the vane structure 28. In some embodiments, the bottom wall of the vane structure 28 has a plurality of slits SL adjacent to the drip pins 60. In some embodiments, the slits SL are communicated with the bottom circumferential gutter 28b, so the debris may leave the vane structure 28 from the slits SL. For example, the debris in the bottom circumferential gutter 28b may pass through the slits SL of the vane structure 28 to arrive at the drip pins 60. In some embodiments, the drip pins 60 are capable of providing a dripping path for the debris. For example, the debris may flow along the drip pins 60 to arrive at the tip of the drip pins 60.

In some embodiments, the radiation source 110 of the EUV lithography system 100 further includes a heating device 50 disposed between the vane structure 28 and the van bucket module 32. In some embodiments, the heating device 50 includes a plurality of through openings OP. As illustrated in FIG. 4, the drip pins 60 are aligned with the through openings OP and are extended into the through openings OP. That is, the drip pins 60 are inserted into the heating device 50 from the through openings OP. In some embodiments, the heating device 50 is able to provide a temperature higher than the melting temperature of the debris. For example, the heating device 50 may heat the drip pin 60 to a temperature higher than the melting temperature of tin to ensure that the debris are maintained in a liquid form.

As illustrated in FIG. 4, the vane bucket module 32 includes a collecting tank 324 and a temperature adjusting pack 322 surrounding the collecting tank 324. In some embodiments, the collecting tank 324 is inserted into the temperature adjusting pack 322 and is removable from the temperature adjusting pack 322. For example, the temperature adjusting pack 322 surrounds five surfaces of the collecting tank 324 and one surface of the collecting tank 324 is exposed. The collecting tank 324 may be retrieved from the exposed surface. In some embodiments, the temperature adjusting pack 322 has a plurality of inlets IL aligned with the through openings OP of the heating device 50 and the drip pins 60. In some embodiments, the collecting tank 324 has a cover CV, and the cover CV has a plurality of through holes TH. In some embodiments, the through holes TH of the cover CV are aligned with the inlets IL of the temperature adjusting pack 322, the through openings OP of the heating device 50, and the drip pins 60. In some embodiments, a number of the inlets IL of the temperature adjusting pack 322 corresponds to a number of the through holes TH of the cover CV. For example, the temperature adjusting pack 322 has two inlets IL while the cover CV has two through holes TH aligning with the inlets IL. As such, the debris guided by the drip pins 60 is able to drip through the through openings OP of the heating device 50, the inlets IL of the temperature adjusting pack 322, and the through holes TH of the cover to arrive at the interior of the collecting tank 324.

In some embodiments, the temperature adjusting pack 322 is connected to a controller (not shown), and the controller controls a temperature of the temperature adjusting pack 322. In some embodiments, the temperature of the temperature adjusting pack 322 may be adjusted depending on the status of the debris. For example, if the debris are about to solidify, the controller may signal the temperature adjusting pack 322 to heat up. On the other hand, if the temperature of the debris is too high, the controller may signal the temperature adjusting pack 322 to cool down. In some embodiments, the controller is also able to control the pressure in the vessel chamber 110A.

In some embodiments, the collecting tank 324 is utilized to collect the debris. Once the collecting tank 324 is full of debris, the loaded collecting tank 324 may be replaced by an empty collecting tank 324. In some embodiments, the collecting tank 324 has a heating mechanism embedded therein. For example, the collecting tank 324 may include a battery embedded therein to maintain the interior of the collecting tank 324 at a desired temperature. In some embodiments, since the battery is utilized to maintain the temperature of the interior of the collecting tank 324, the cover CV is often at a temperature lower than the interior of the collecting tank 324. That is, the cover CV is not heated and is at a temperate lower than that of the temperature adjusting pack 322. In some embodiments, when the debris from the tip of the drip pins 60 fails to accurately fall into the through holes TH of the cover CV, the debris would land on a top surface of the cover CV. Since the cover CV has a temperature lower than the debris, the debris would condensate and solidify on the top surface of the cover CV. In some embodiments, accumulation of the solidified debris on the top surface of the cover CV would trigger formation of debris stalagmite. The growth of debris stalagmite would eventually clog the inlets IL of the temperature adjusting pack 322, the through openings OP of the heating device 50, the slits SL of the vane structure 28, and the bottom circumferential gutter 28b. As a result, the debris collected by the vane structure 28 would overflow to the collector 22 to compromise the reflectivity of the collector 22. In order to prevent the foregoing phenomenon, various configurations of the cover CV of the collecting tank 324 may be adopted, and these covers will be described below in conjunction with FIGS. 5A-5B, 6A-6B, and 7A-7B.

Figure 5A:
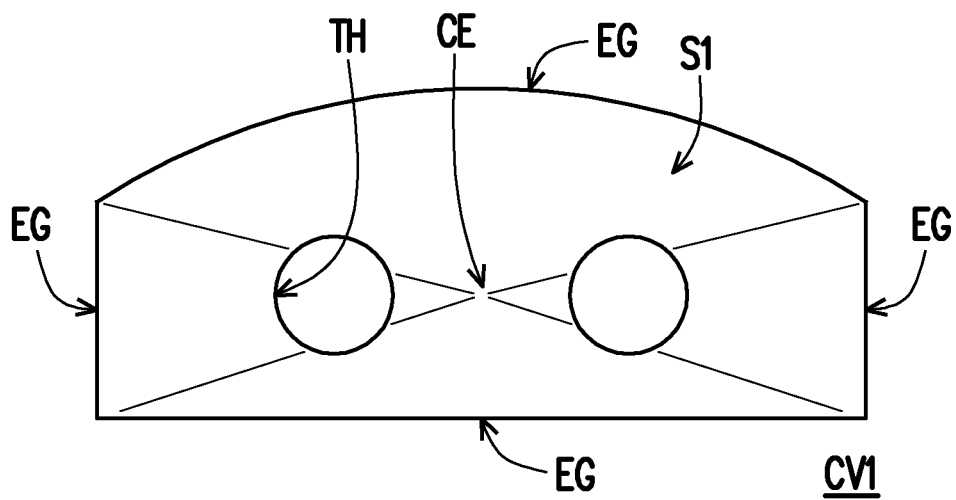
FIG. 5A is a schematic top view of a cover of a collecting tank in a vane bucket module in accordance with some embodiments of the disclosure.
Figure 5B:
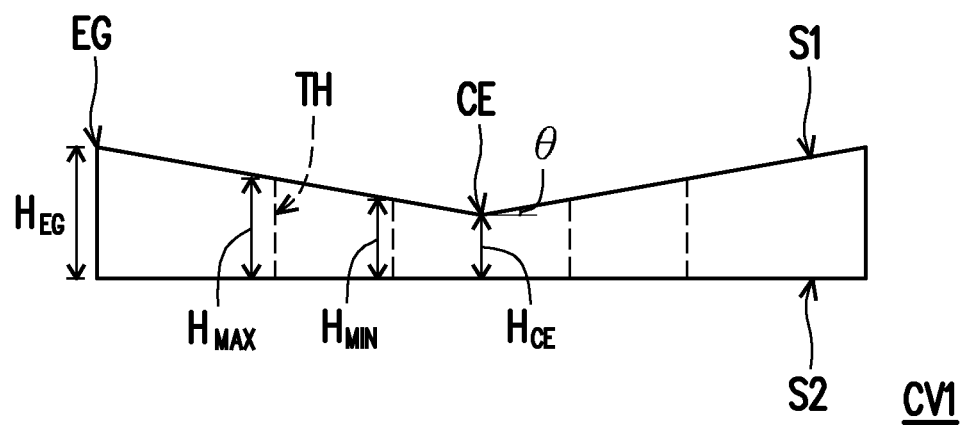
FIG. 5B is a schematic cross-sectional view of the cover in FIG. 5A.

FIG. 5A is a schematic top view of a cover CV1 of a collecting tank 324 in a vane bucket module 32 in accordance with some embodiments of the disclosure. FIG. 5B is a schematic cross-sectional view of the cover CV1 in FIG. 5A. Referring to FIG. 5A and FIG. 5B, the cover CV1 has a top surface S1 and a bottom surface S2 opposite to the top surface S1. In some embodiments, the top surface S1 is a concave surface while the bottom surface S2 is a flat surface. That is, at least a portion of the top surface S1 is inclined with respect to the bottom surface S2 of the cover CV1. In some embodiments, an inclination angle θ of the top surface S1 with respect to a virtual line parallel to the bottom surface S2 ranges from 20° to 30°. In some embodiments, the inclination of the top surface S1 of the cover CV1 starts from four edges EG of the top surface S1 toward a center CE of the top surface S1. For example, a level height of the center CE of the top surface S1 is lower than level heights of edges EG of the top surface S1 of the cover CV1. As illustrated in FIG. 5B, a thickness $H_{EG}$ of the edges EG of the cover CV1 is greater than a thickness $H_{CE}$ of a center CE of the cover CV1. In some embodiments, the inclination of the top surface S1 is continuous from the edges EG toward the center CE. In other words, a thickness of the cover CV1 decreases continuously from the edges EG of the cover CV1 to the center CE of the cover CV1. In some embodiments, the cover CV1 includes two through holes TH. In some embodiments, a depth of each through hole TH is not uniform. For example, as illustrated in FIG. 5B, a depth of each through hole TH decreases continuously towards the center CE of the cover CV1. That is, a maximum depth $H_{MAX}$ of the through hole TH is greater than a minimum depth $H_{MIN}$ of the through hole TH. In some embodiments, the thickness $H_{CE}$ of the center CE of the cover CV1 is smaller than the minimum depth $H_{MIN}$ of the through hole TH, the minimum depth $H_{MIN}$ of the through hole TH is smaller than the maximum depth $H_{MAX}$ of the through hole TH, and the maximum depth $H_{MAX}$ of the through hole TH is smaller than the thicknesses $H_{EG}$ of the edges EG of the cover CV1. In some embodiments, the through holes TH are arranged in mirror symmetry.

In some embodiments, due to the gravity, the slanted top surface S1 of the cover CV1 allows the debris landed on the top surface S1 of the cover CV1 to fall into the through holes TH before solidification occurs. As such, the phenomenon of debris accumulation or debris stalagmite formation mentioned above may be eliminated, thereby extending the lifetime of the collector 22 by at least 25% while ensuring excellent reflectivity of the collector 22. As a result, the quality of the EUV light EL generated by the radiation source 110 may be ensured, and high energy EUV light EL may be utilized in the EUV lithography system 100.

Figure 6A:
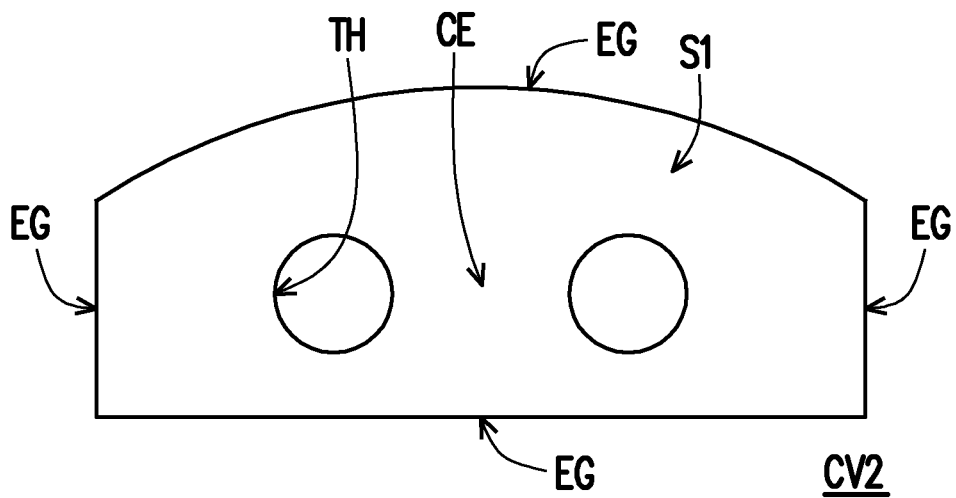
FIG. 6A is a schematic top view of a cover of a collecting tank in a vane bucket module in accordance with some alternative embodiments of the disclosure.
Figure 6B:
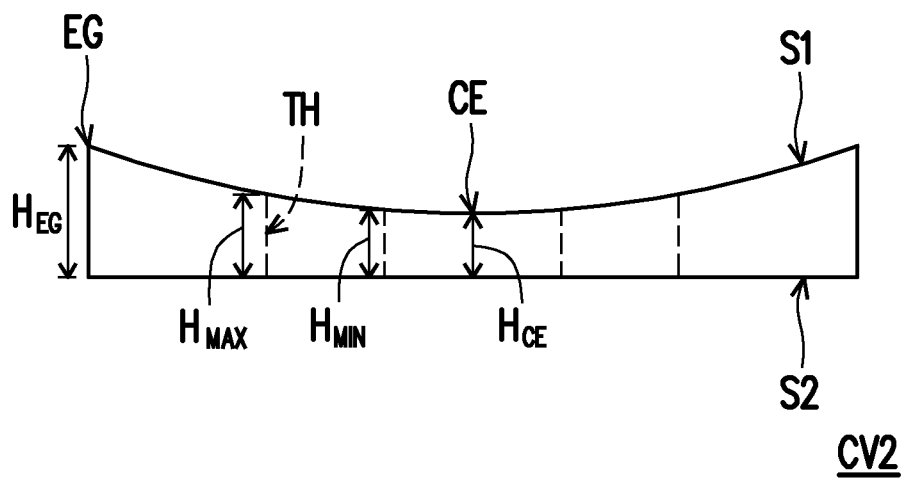
FIG. 6B is a schematic cross-sectional view of the cover in FIG. 6A.

FIG. 6A is a schematic top view of a cover CV2 of a collecting tank 324 in a vane bucket module 32 in accordance with some alternative embodiments of the disclosure. FIG. 6B is a schematic cross-sectional view of the cover CV2 in FIG. 6A. Referring to FIG. 6A and FIG. 6B, the cover CV2 has a top surface S1 and a bottom surface S2 opposite to the top surface S1. In some embodiments, the top surface S1 is a concave surface while the bottom surface S2 is a flat surface. For example, the top surface S1 of the cover CV2 is a curved surface. In some embodiments, a center CE of the top surface S1 corresponds to the inflection point of the curved surface. For example, a level height of the center CE of the top surface S1 is lower than level heights of edges EG of the top surface S1 of the cover CV2. As illustrated in FIG. 6B, thicknesses $H_{EG}$ of the edges EG of the cover CV2 is greater than a thickness $H_{CE}$ of a center CE of the cover CV2. In some embodiments, a thickness of the cover CV2 decreases continuously from the edges EG of the cover CV2 to the center CE of the cover CV2. In some embodiments, the cover CV2 includes two through holes TH. In some embodiments, a depth of each through hole TH is not uniform. For example, as illustrated in FIG. 6B, a depth of each through hole TH decreases continuously towards the center CE of the cover CV2. That is, a maximum depth $H_{MAX}$ of the through hole TH is greater than a minimum depth $H_{MIN}$ of the through hole TH. In some embodiments, the thickness $H_{CE}$ of the center CE of the cover CV2 is smaller than the minimum depth $H_{MIN}$ of the through hole TH, the minimum depth $H_{MIN}$ of the through hole TH is smaller than the maximum depth $H_{MAX}$ of the through hole TH, and the maximum depth $H_{MAX}$ of the through hole TH is smaller than the thicknesses $H_{EG}$ of the edges EG of the cover CV2. In some embodiments, the through holes TH are arranged in mirror symmetry.

In some embodiments, due to the gravity, the curved top surface S1 of the cover CV2 allows the debris landed on the top surface S1 of the cover CV2 to fall into the through holes TH before solidification occurs. As such, the phenomenon of debris accumulation or debris stalagmite formation mentioned above may be eliminated, thereby extending the lifetime of the collector 22 by at least 25% while ensuring excellent reflectivity of the collector 22. As a result, the quality of the EUV light EL generated by the radiation source 110 may be ensured, and high energy EUV light EL may be utilized in the EUV lithography system 100.

Figure 7A:
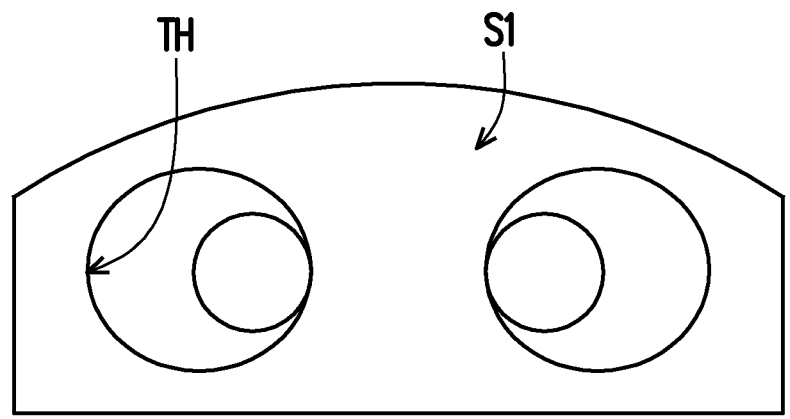
FIG. 7A is a schematic top view of a cover of a collecting tank in a vane bucket module in accordance with some alternative embodiments of the disclosure.
Figure 7B:
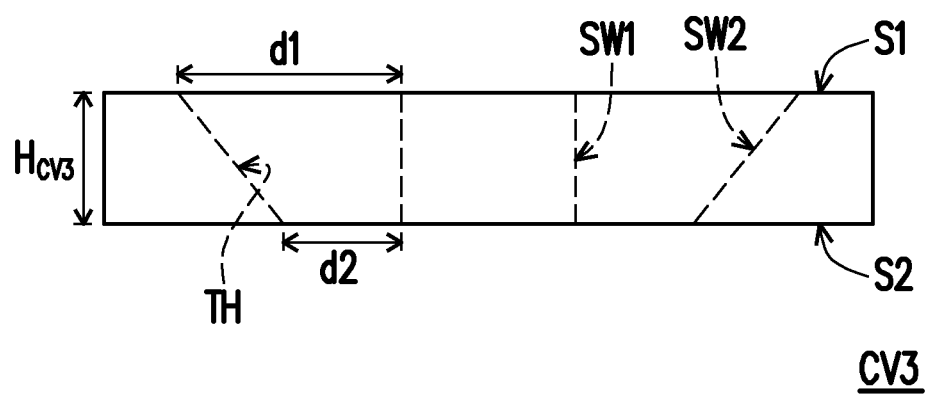
FIG. 7B is a schematic cross-sectional view of the cover in FIG. 7A.

FIG. 7A is a schematic top view of a cover CV3 of a collecting tank 324 in a vane bucket module 32 in accordance with some alternative embodiments of the disclosure. FIG. 7B is a schematic cross-sectional view of the cover CV3 in FIG. 7A. Referring to FIG. 7A and FIG. 7B, the cover CV3 has a top surface S1 and a bottom surface S2 opposite to the top surface S1. In some embodiments, the top surface S1 and the bottom surface S2 are both flat surfaces. For example, the cover CV3 has a uniform thickness $H_{CV3}$. In some embodiments, the cover CV3 has two through holes TH. As illustrated in FIG. 7B, a top portion of each through hole TH is larger than a bottom portion of each through hole TH. In some embodiments, the top portion of each through hole TH has a diameter d1 and a bottom portion of each through hole TH has a diameter d2, and the diameter d1 is greater than the diameter d2. As illustrated in FIG. 7A, the top portion of the through hole TH and the bottom portion of the through hole TH are eccentric. In other words, the top portion of the through hole TH and the bottom portion of the through hole TH have an offset. For example, each through hole TH may take the form of a slanted funnel. In some embodiments, a portion of a sidewall SW1 of each through hole TH is perpendicular to the top surface S1 and the bottom surface S2 of the cover CV3. Meanwhile, another portion of the sidewall SW2 of each through hole TH is inclined with respect to the top surface S1 and the bottom surface S2 of each through hole TH. In some embodiments, since the top portion of the through hole TH is larger than the bottom portion of the through hole TH, an area of the top surface S1 is smaller than an area of the bottom surface S2. In some embodiments, the through holes TH are arranged in mirror symmetry.

In some embodiments, larger percentage of the top surface S1 of the cover CV3 is being occupied by the through holes TH, so the debris dripping from the drip pin 60 may be easily fall into the through hole TH to avoid the phenomenon of debris accumulation or debris stalagmite formation mentioned above. As such, the lifetime of the collector 22 may be extended by at least 25% and the reflectivity of the collector 22 may be ensured. As a result, the quality of the EUV light EL generated by the radiation source 110 may be ensured, and high energy EUV light EL may be utilized in the EUV lithography system 100.

In accordance with some embodiments of the disclosure, an extreme ultraviolet (EUV) lithography system includes a vane bucket module. The vane bucket module includes a collecting tank and a temperature adjusting pack. The collecting tank has a cover and the cover includes a plurality of through holes. Thicknesses of edges of the cover is greater than a thickness of a center of the cover. The temperature adjusting pack surrounds the collecting tank. The temperature adjusting pack includes a plurality of inlets aligned with the through holes.

In accordance with some embodiments of the disclosure, an extreme ultraviolet (EUV) lithography system includes a collector, a droplet generator, a droplet catcher, and a vane bucket module. The collector is configured to collect and reflect EUV light generated from plasma. The droplet generator, the droplet catcher, and the vane bucket module each being spaced apart from one another. The droplet generator, the droplet catcher, and the vane bucket module surround a center of the collector. The vane bucket module includes a collecting tank and a temperature adjusting pack. The collecting tank has a cover and the cover includes a plurality of through holes. The cover has a concaved top surface. The temperature adjusting pack surrounds the collecting tank. The temperature adjusting pack includes a plurality of inlets aligned with the through holes.

In accordance with some embodiments of the disclosure, an extreme ultraviolet (EUV) lithography system includes a collector, a droplet generator, a droplet catcher, and a vane bucket module. The collector is configured to collect and reflect EUV light generated from plasma. The droplet generator, the droplet catcher, and the vane bucket module each being spaced apart from one another. The droplet generator, the droplet catcher, and the vane bucket module surround a center of the collector. The vane bucket module includes a collecting tank and a temperature adjusting pack. The collecting tank has a cover and the cover includes a plurality of through holes. A top portion of each through hole is larger than a bottom portion of each through hole. The temperature adjusting pack surrounds the collecting tank. The temperature adjusting pack includes a plurality of inlets aligned with the through holes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An extreme ultraviolet (EUV) lithography system, comprising:
    a vane bucket module, comprising:
        a temperature adjusting pack having a plurality of inlets; and
        a collecting tank inserted into the temperature adjusting pack, wherein the collecting tank has a cover, the cover comprises a plurality of through holes, the inlets of the temperature adjusting pack are aligned with the through holes of the cover, and thicknesses of edges of the cover is different from a thickness of a center of the cover.

2. The EUV lithography system of claim 1, wherein a thickness of the cover decreases continuously from the edges of the cover to the center of the cover.

3. The EUV lithography system of claim 1, wherein a depth of each through hole is not uniform.

4. The EUV lithography system of claim 1, wherein a depth of each through hole decreases continuously towards the center of the cover.

5. The EUV lithography system of claim 1, wherein the thickness of the center of the cover is smaller than a minimum depth of each through hole.

6. The EUV lithography system of claim 1, further comprising:
    a collector;
    a droplet generator and a droplet catcher disposed on two opposite sides of the collector along a first direction; and
    a monitoring module, wherein the vane bucket module and the monitoring module are disposed on two opposite sides of the collector along a second direction perpendicular to the first direction.

7. The EUV lithography system of claim 6, further comprising:
    a vane structure disposed over the collector, wherein the vane structure comprises a plurality of vertical gutters and a plurality of circumferential gutters connected with the vertical gutters;
    a plurality of drip pins protruding from the vane structure and communicated with one of the circumferential gutters, wherein the drip pins are aligned with the inlets of the temperature adjusting pack and the through holes of the cover; and
    a heating device disposed between the vane structure and the vane bucket module, wherein the heating device comprises a plurality of through openings aligned with the inlets of the temperature adjusting pack and the through holes of the cover, and the drip pins extend into the through openings.

8. An extreme ultraviolet (EUV) lithography system, comprising:
    a collector, configured to collect and reflect EUV light generated from plasma; and
    a droplet generator, a droplet catcher, and a vane bucket module each spaced apart from one another, wherein the droplet generator, the droplet catcher, and the vane bucket module are disposed over the collector, and the vane bucket module comprises:
        a temperature adjusting pack having a plurality of inlets; and
        a collecting tank inserted into the temperature adjusting pack, wherein the collecting tank has a cover, the cover comprises a plurality of through holes, the inlets of the temperature adjusting pack are aligned with the through holes of the cover, the cover has a top surface facing the inlets of the temperature adjusting pack and a bottom surface opposite to the top surface, and the top surface of the cover is not flat.

9. The EUV lithography system of claim 8, wherein at least a portion of the top surface of the cover is inclined with respect to the bottom surface of the cover.

10. The EUV lithography system of claim 9, wherein an inclination angle of the at least a portion of the top surface of the cover ranges from 20° to 30°.

11. The EUV lithography system of claim 8, wherein the top surface of the cover is a curved surface.

12. The EUV lithography system of claim 8, wherein a level height of a center of the top surface of the cover is lower than level heights of edges of the top surface of the cover.

13. The EUV lithography system of claim 8, further comprising a monitoring module, wherein the droplet generator and the droplet catcher are disposed on two opposite sides of the collector along a first direction, and the vane bucket module and the monitoring module are disposed on two opposite sides of the collector along a second direction perpendicular to the first direction.

14. The EUV lithography system of claim 8, further comprising:
    a vane structure disposed over the collector, wherein the vane structure comprises a plurality of vertical gutters and a plurality of circumferential gutters connected with the vertical gutters;
    a plurality of drip pins protruding from the vane structure and communicated with one of the circumferential gutters, wherein the drip pins are aligned with the inlets of the temperature adjusting pack and the through holes of the cover; and
    a heating device disposed between the vane structure and the vane bucket module, wherein the heating device comprises a plurality of through openings aligned with the inlets of the temperature adjusting pack and the through holes of the cover, and the drip pins extend into the through openings.

15. An extreme ultraviolet (EUV) lithography system, comprising:
- a collector, configured to collect and reflect EUV light generated from plasma; and
- a droplet generator, a droplet catcher, and a vane bucket module each spaced apart from one another, wherein the droplet generator, the droplet catcher, and the vane bucket module surround a center of the collector, and the vane bucket module comprises:
    - a collecting tank having a cover, the cover comprises a plurality of through holes, wherein each of the through holes has a first opening located at a top surface of the cover and a second opening located at a bottom surface of the cover, and a size of the first opening is different from a size of the second opening; and
    - a temperature adjusting pack surrounding the collecting tank, wherein the temperature adjusting pack comprises a plurality of inlets aligned with the first openings of the through holes.

16. The EUV lithography system of claim 15, wherein a portion of a sidewall of each through hole is perpendicular to the top surface and the bottom surface of the cover, and another portion of the sidewall of each through hole is inclined with respect to the top surface and the bottom surface of the cover.

17. The EUV lithography system of claim 15, wherein the plurality of through holes is two through holes, and the two through holes are arranged in mirror symmetry.

18. The EUV lithography system of claim 15, wherein the first opening and the second opening are eccentric.

19. The EUV lithography system of claim 15, further comprising a monitoring module, wherein the droplet generator and the droplet catcher are disposed on two opposite sides of the collector along a first direction, and the vane bucket module and the monitoring module are disposed on two opposite sides of the collector along a second direction perpendicular to the first direction.

20. The EUV lithography system of claim 15, further comprising:
- a vane structure disposed over the collector, wherein the vane structure comprises a plurality of vertical gutters and a plurality of circumferential gutters connected with the vertical gutters;
- a plurality of drip pins protruding from the vane structure and communicated with one of the circumferential gutters, wherein the drip pins are aligned with the inlets of the temperature adjusting pack and the through holes of the cover; and
- a heating device disposed between the vane structure and the vane bucket module, wherein the heating device comprises a plurality of through openings aligned with the inlets of the temperature adjusting pack and the through holes of the cover, and the drip pins extend into the through openings.

\* \* \* \* \*